(12) United States Patent
Watanabe et al.

(10) Patent No.: US 6,555,846 B1
(45) Date of Patent: Apr. 29, 2003

(54) METHOD FOR MANUFACTURING A NITRIDE SEMICONDUCTOR DEVICE AND DEVICE MANUFACTURED BY THE METHOD

(75) Inventors: Atsushi Watanabe, Tsurugashima (JP); Toshiyuki Tanaka, Tsurugashima (JP); Hiroyuki Ota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/589,076

(22) Filed: Jun. 8, 2000

(30) Foreign Application Priority Data

Jun. 10, 1999  (JP) ............................................ 11-164169

(51) Int. Cl.$^7$ ............................................... H01L 29/22
(52) U.S. Cl. ........................... 257/94; 257/97; 257/103; 257/190
(58) Field of Search ................................ 257/103, 190, 257/201, 85, 94, 96, 97

(56) References Cited

U.S. PATENT DOCUMENTS

| 5,091,333 | A | * | 2/1992 | Fan et al. ..................... 437/82 |
| 5,895,706 | A | * | 4/1999 | Yoshinaga |
| 5,927,995 | A | * | 7/1999 | Chen et al. ................... 438/517 |
| 6,010,937 | A | * | 1/2000 | Karam et al. ................. 438/363 |
| 6,015,979 | A | * | 1/2000 | Sugiura et al. ................. 257/86 |
| 6,281,524 | B1 | * | 8/2001 | Yamamoto et al. |

* cited by examiner

Primary Examiner—Sara Crane
(74) Attorney, Agent, or Firm—Sughrue Mion, PLLC

(57) ABSTRACT

A group III nitride semiconductor device is disclosed which has a reduced number of threading dislocations adversely affecting characteristics of the group III nitride semiconductor device. A method for manufacturing the group III nitride semiconductor device controls pit formation in a GaN layer formed on a sapphire substrate.

First, a low temperature buffer layer is formed on a sapphire substrate by MOCVD. An undoped GaN layer having a predetermined thickness is then grown on the low temperature buffer layer. Next, a GaN layer containing magnesium as a dopant is formed on the layer at a lower pressure than that of depositing the GaN layer, which results in filling pits generated on the GaN layer to flatten the surface of another GaN layer.

18 Claims, 3 Drawing Sheets

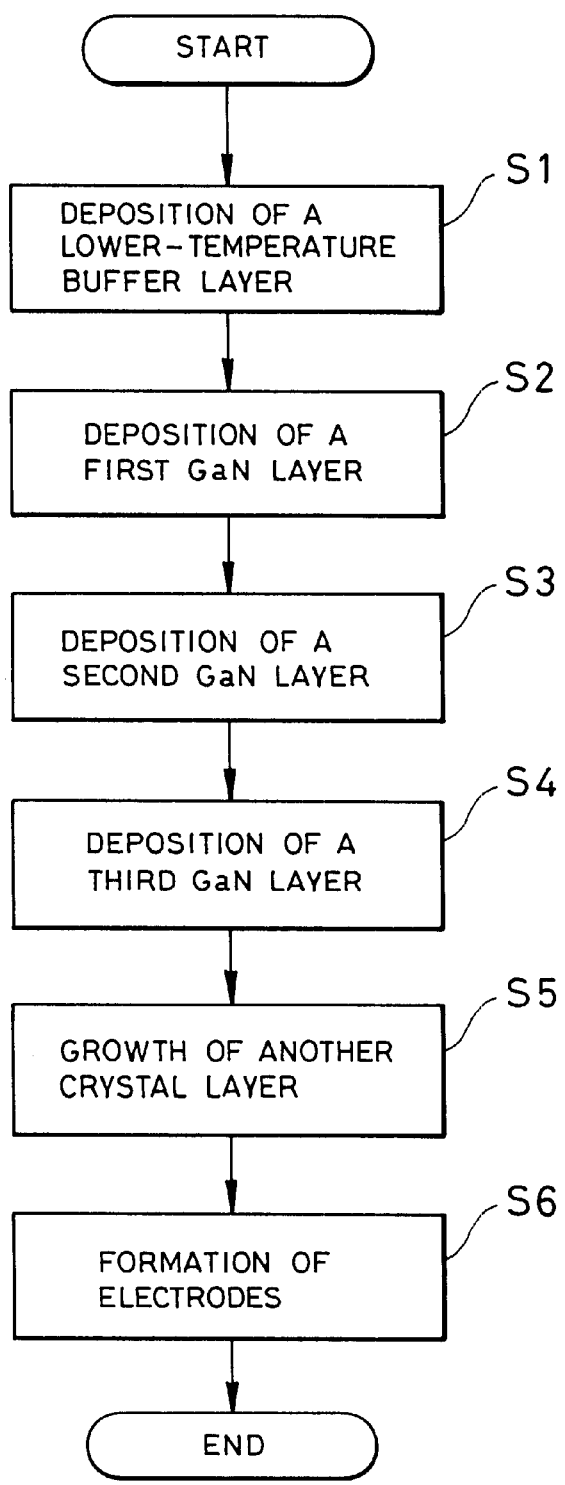

METHOD FOR MANUFACTURING A NITRIDE SEMICONDUCTOR DEVICE AND DEVICE MANUFACTURED BY THE METHOD

BACKGROUND OF THE INVENTION

1. Field of the Invention

The present invention relates to a method for manufacturing a group III nitride semiconductor device.

2. Prior Art

Extensive researches is now underway on nitride-gallium and related compound semiconductor as a material system for short wavelength light emitting devices, in particular short wave length semiconductors lasers. A semiconductor laser device is manufactured by forming a semiconductor single-crystal film on a crystal substrate. Characteristics of a light emitting device as a laser device are greatly dependent on the density of crystal defects in the single-crystal film. From this point of view, the substrate is preferable to be made of a material having the physical-property constants such as crystal structure, lattice constant, and thermal-expansion coefficient the same as those of a semiconductor crystal to be expitaxially grown on the substrate. For example, it is ideal to use a single crystal of gallium nitride (hereinafter referred to as GaN), which is the same as an epitaxial film. However, it is very difficult to form a large crystal of GaN. A GaN single-crystal ingot having a size usable as a wafer has never been formed. Therefore, a sapphire substrate has been used as a substrate.

Metal-organic chemical vapor deposition (hereinafter referred to as MOCVD) is most generally used to form a GaN single-crystal film. In this method, trimethylgallium (referred to as TMG hereinafter) is used as a group III precursor material, and ammonia (referred to as $NH_3$ hereinafter) is used as a group V precursor material for the material of the MOCVD.

When forming a GaN semiconductor film by the above method, the crystal is grown at the temperatures of 900–1100° C. At the higher temperature, semiconductor crystal such as gallium arsenide (GaAs) is unstable so that it is not a proper material for a substrate. Thus, single-crystal sapphire is adopted as a substrate. This is because sapphire is stable at the above high temperature though the physical properties of sapphire are different from those of GaN.

However, the direct growth of GaN on a sapphire substrate can not produce a higher-quality single-crystal film for a light emitting element, because sapphire has a lattice constant different from that of GaN by approximately 14%. Therefore, an approach, known as the two-step-growth method, to moderate the misfit of the lattice constant between a GaN single-crystal film and sapphire, has been developed. The steps in the two-step-growth method are: forming a low temperature buffer layer of aluminum nitride (AlN) or GaN on a sapphire substrate at a low temperature of 400–600° C., heating the substrate with the buffer layer, and then epitaxial-growing GaN on the buffer layer. Thus, the two-step-growth method has stably produced a comparatively smooth single-crystal film.

However, it has been found that the GaN film produced by the above method has high-density defects of $1 \times 10^8 - 1 \times 10^{10}$ ($1/cm^2$), and the above value shows a very high density, which is 10,000–100,000 times greater than that of GaAs. Such a defect is called "threading dislocation", which is linearly extending crystal defect that penetrates a crystal film from its top to the bottom. The threading dislocation works as the non-radiative recombination center of carriers. Therefore, it is known that as the threading dislocation density increases, the light emitting efficiency of the semiconductor crystal decreases.

Though a light emitting efficiency characteristic of GaN is less affected by the dislocation density, compared to that of a conventional optical semiconductor such as GaAs, the existence of a large number of dislocation degrades the light emitting efficiency.

The dislocation density depends on conditions of the epitaxial growth, and particularly depends on the growth pressure. Moreover, it is known that the threading dislocation density decreases as the growth pressure increases, as described in Japan Journal of Applied Physics, Vol. 37 (1998) p. 4460–4466. Therefore, the epitaxial growth on a sapphire substrate is generally performed at approximately atmosphere pressure (760 torr).

It is known that crystal nuclei grow three-dimensionally, like islands, at the beginning of growth, and that they then combine and grow two-dimensionally, when a low-temperature buffer layer of GaN or AlN is formed on a sapphire substrate and then the GaN crystal is grown on the buffer layer at a higher temperature (approximately 1000° C.). Therefore, a hexagonal-pyramidal hole called a "pit" may be formed in the GaN expitaxial film. The presence of pits makes the production of a good device on or near the pit difficult. That is, a higher pit density of an expitaxial wafer may result in the decrease of device production during manufacturing.

It is known that the pit density also greatly depends on the growth pressure and that it increases more as the growth pressure increases. Therefore, as described above, it is clear that a dislocation density and a pit density are mutually contradictory. Thus, a problem arises that the increase of the growth pressure for decreasing a dislocation density may cause the increase of a pit density, thereby leading to the decrease of a manufacturing yield of a device.

An object of the present invention is to solve the above problems to provide a nitride semiconductor device and a method for manufacturing the nitride semiconductor device which has a reduced dislocation density while suppressing the generation of pits in a GaN layer.

SUMMARY OF THE INVENTION

A method for manufacturing a nitride semiconductor device according to the present invention is characterized in that the method comprises the steps of successively depositing a group III nitride semiconductor ($In_xGa_{(1-x-y)}Al_yN$ ($0 \leq x \leq 1$, $0 \leq y \leq 1$)) on a flat sapphire substrate by metal-organic chemical vapor deposition. The method comprises the steps of: forming a low temperature buffer layer on the sapphire substrate, forming a first gallium nitride layer on the low temperature buffer layer by supplying a first mixed gas containing no dopant component, and forming a second gallium nitride layer containing a dopant on the first gallium nitride layer while filling voids and flattening a surface of the first gallium nitride layer by supplying a second mixed gas containing a dopant component.

A nitride semiconductor device according to the present invention is characterized in that the device is manufactured by depositing a group III nitride semiconductor ($In_xGa_{(1-x-y)}Al_yN$ ($0 \leq x \leq 1$, $0 \leq y \leq 1$)) on a flat sapphire substrate. The group III nitride semiconductor device comprises a low temperature buffer layer deposited on the sapphire substrate; a first gallium nitride layer having a first predetermined thickness, containing no dopant component, and being deposited on the low temperature buffer layer; and a second gallium nitride layer having a second predetermined thickness containing a dopant component, the second gallium nitride layer being deposited on the first gallium nitride layer; wherein the second gallium nitride layer is deposited while flattening the surface of the first gallium nitride layer by filling voids in the first gallium nitride layer.

BRIEF DESCRIPTION OF THE DRAWINGS

The aforementioned aspects and other features of the invention are explained in the following description, taken in connection with the accompanying drawing figures wherein:

FIG. 3 is a flow chart showing a method for manufacturing a nitride semiconductor device according to the present invention.

DESCRIPTION OF PREFERRED EMBODIMENTS

The present invention will be described in conjunction with a preferred embodiment, referring to the accompanying drawings.

Figure 1:
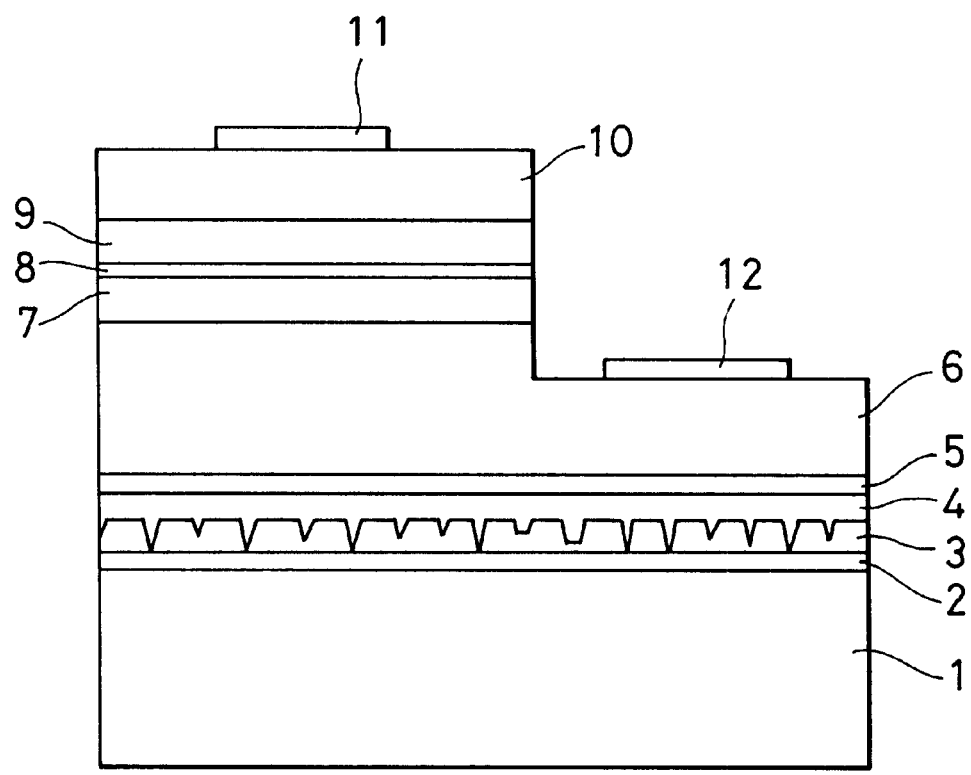
FIG. 1 is a sectional view showing a nitride semiconductor device according to the present invention.

As shown in FIG. 1, a nitride semiconductor device according to the present invention comprises a multilayer structure in which nitride semiconductor single-crystal layers are formed on a sapphire substrate 1. A low temperature buffer layer 2 of AlN or GaN is formed on the sapphire substrate 1. A non-doped GaN crystal layer 3 is formed on the low-temperature buffer layer 2 as a first GaN layer. The non-doped GaN crystal layer 3 takes on an island-like structure without any dopant. A second GaN layer 4 containing a dopant is formed on the first GaN layer. The second GaN layer 4 is deposited while filling pyramidal surface voids in the first GaN layer 3 and flattening the surface of the GaN layer 3.

Moreover, a non-doped GaN crystal film 5 is formed on the second GaN layer 4 as a third GaN layer. Further, a crystal layer 6 is formed on the layer 5. In this embodiment, it should be noted that the crystal layer 6 is made of Si-doped n-type GaN.

Furthermore, an n-type cladding layer 7, an active layer 8, a p-type cladding 9, and a p-type contact layer 10 are formed in the stated order on the layer 6. Then, a p-type electrode 11 and an n-type electrode 12 are formed on the p-type contact layer 10 and the fourth crystal layer 6, respectively. Thus, a semiconductor light emitting device is manufactured.

Figure 2:
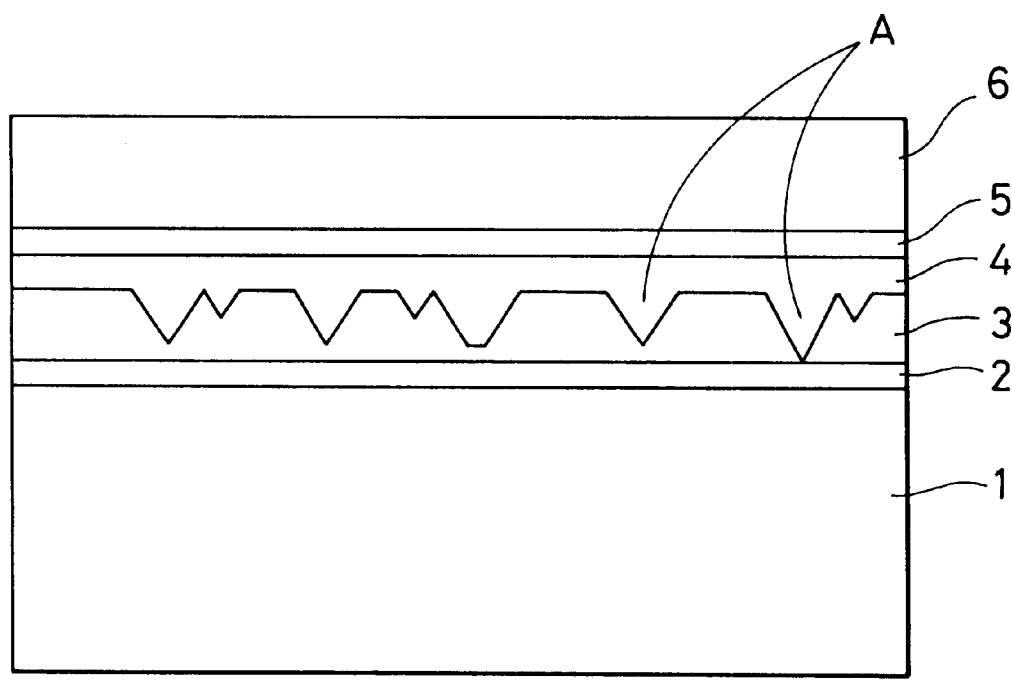
FIG. 2 is a partial enlarged sectional view of the nitride semiconductor device shown in FIG. 1.

A method for manufacturing a nitride semiconductor device according to the present invention will be described below in conjunction with FIGS. 2 and 3.

A sapphire substrate 1 is loaded into a layer-forming MOCVD reactor. Then, the substrate 1 is placed in a hydrogen gas flow having a pressure of 300 torr at a temperature of 1050° C. for 10 minutes to heat-clean the surface of the sapphire substrate 1. Thereafter, the sapphire substrate 1 is cooled to the temperature of 400° C. Then, anmonia $NH_3$ as nitrogen precursor material and trimethyl aluminuman TMA as a Al precursor material are introduced into the reactor to deposit AlN, thereby forming a low-temperature buffer layer 2 of AlN having a thickness of 50 nm (step S1).

Then, after stopping the supply of TMA, the growth pressure is changed from 300 torr to 600 torr while only $NH_3$ gas is flowing through the reactor. Moreover, the sapphire substrate 1 with the low-temperature buffer layer 2 is heated up to the temperature of 1050° C. again. TMG (trimethylgallium) is then introduced as a first mixed gas to cause a non-doped GaN layer 3 to be grown (step S2). While the non-doped GaN layer 3 is deposited, GaN-crystal nuclei are initially produced on the low-temperature buffer layer 2. The nuclei proceed to three-dimensional growth, and continuously grow while forming an island-like structure.

When the non-doped GaN layer 3 is grown to a nominal thickness of approximately 0.5 μm, the supply of TMG is stopped and the pressure is changed to 300 torr again. It should be understood that the nominal thickness value assumes that a layer grows uniformly.

Then, Et-Cp2Mg (ethyl-biscyclopentadienylmagnesium) is introduced into the reactor in conjunction with TMG and $NH_3$ as a second mixed gas in order to use Mg as a dopant. The deposition of a GaN:Mg layer 4 as a second GaN layer is then started (step S3). In this embodiment, a flow rate of Et-Cp2Mg is selected so that an atomic concentration of Mg is selected to be $1 \times 10^{18} - 5 \times 10^{20}$ (1/cc). A concentration of Mg is selected so that it promotes the two-dimensional growth of the GaN:Mg layer. The GaN:Mg layer 4 is grown to a nominal thickness of 0.5 μm.

In this embodiment, the GaN:Mg layer 4 has a thickness of 0.5 μm. However, it should be noted that the GaN:Mg layer 4 may have any thickness, as long as pits formed on the surface of the non-doped GaN layer 3 are filled to flatten the surface of the GaN:Mg layer 4.

Then, the only supply of Et-Cp2Mg is stopped to cause a non-doped GaN layer 5 to be grown for 1–10 minutes (step S4). Then, Me-SiH$_3$ (methylsilane) is introduced to grow a GaN:Si layer 6 of 2 μm (step S5). In this embodiment, the flow rate of Me-SiH$_3$ is set so that an atomic concentration of Si is set to be $1 \times 10^{17}$(1/cc).

When growth of the GaN:Si layer 6 is completed, the supply of TMG and Me—SiH$_3$ is stopped, and the substrate starts to be cooled. When a substrate is cooled to a temperature of 400° C. or lower, the supply of $NH_3$ is also stopped. Moreover, when the substrate temperature is cooled to room temperature, the substrate is unloaded out of the reactor. This is used as a sample (1) for a comparison to be described later.

Furthermore, an n-type cladding layer 7, an active layer 8, a p-type cladding layer 9, and a p-type contact layer 10 are deposited in order on the GaN:Si layer 6. A p-type electrode 11 and an n-type electrode 12 are then formed on the p-type contact layer 10 and the fourth crystal layer 6, respectively (step S6). As described above, a semiconductor device is manufactured.

For comparison with the sample (1), a sample (2) is manufactured by growing the first GaN layer 3 and then growing the GaN:Si layer 6 to 2 μm while keeping the pressure at 600 torr. Moreover, a sample (3) is manufactured by growing both of the first GaN layer 3 and GaN:Si layer 6 at a pressure of 300 torr. When comparing the samples (2) and (3) with the sample (1), conditions such as film thicknesses and doping concentrations are the same except that the samples (2) and (3) lack of the second GaN layer 4 and non-doped GaN layer 5.

The pit density of the surface, Hall mobility, and EPD or dislocation density of each of the sample were evaluated. The results are shown in Table 1.

TABLE 1

|  | Pit density (1/mm²) | Hall mobility (cm²/Vs) | EPD (1/cm²) |
| --- | --- | --- | --- |
| Sample (1) | 73 | 437 | $1.2 \times 10^9$ |
| Sample (2) | 650 | 451 | $1.2 \times 10^9$ |
| Sample (3) | 20 | 107 | $8.6 \times 10^9$ |

Referring to Table 1, it can be seen that Hall mobility correlates with EPD and that the EPD decreases as the Hall mobility increases. Moreover, it is found that EPDs of the samples (1) and (2) are lower than the EPD of the sample (3). The samples (1) and (3) respectively have a low pit density but the sample (2) has a high pit density. Furthermore, it is found that all pits on the first GaN layer 3 are filled with the second GaN layer 4, and that the film has a flattened upper surface over the pits. The finding was made by observing a cross section of the sample (1) with a scanning electron microscope (SEM). Thus, a propagation of pits in the thickness direction, which generated in the first GaN layer, can be avoided while suppressing the increase of the dislocation density.

Moreover, the first GaN layer 3 preferably has a thickness at which the growth of a non-doped GaN layer starts to change from an initial three-dimensional growth form to a two-dimensional growth form. The thickness mentioned above is suitable for two-dimensional growth of the second GaN layer. Therefore, the first GaN film 3 has a thickness of 0.2 μm as its lower limit, at which crystal nuclei start to combine. As the thickness of the first GaN layer 3 increases, the depth of a pit formed on the surface may increase. This leads the GaN:Mg layer 4 over the pits to have an increasing thickness in order to fill the pits. Therefore, the first GaN film 3 also has a thickness of 4 μm as its upper limit in view of shortening the time required to fill voids in the island-like structure for flattening the layer.

The non-doped GaN layer 5 is formed between the GaN:Mg layer 4 and the GaN:Si layer 6 in order to prevent Mg from affecting the growth of the GaN:Si layer 6. The reason is described below. That is, Mg may remain in the reactor and/or pipe for a while after stopping the supply of Et-Cp2Mg (this phenomenon is called Mg memory effect). Therefore, if the GaN:Si layer 6 is grown just after forming the GaN:Mg layer 4, Mg remaining in the reactor or the pipe may be deposited on the surface in the period from the stop of the supply of Et-Cp2Mg to the start of the growth of the GaN:Si layer 6. Therefore, the remaining Mg causes the GaN:Si layer 6 to start the three-dimensional growth again, when the GaN:Si layer 6 starts to grow. This may adversely increase the number of pits. However, the Mg memory effect does not always occur. The memory effect depends on a design of an MOCVD reactor or a depositing condition of the GaN:Si layer 6, so that it may not occur immediately after stopping the supply of Et-Cp2Mg. Therefore, it should be noted that the deposition of the non-doped GaN layer 5 may be omitted.

Moreover, it should be understood that an Si atomic concentration of the GaN:Si layer 6 is not restricted to $1 \times 10^{17}$(1/cc) of this embodiment. It is also within the scope of the invention to provide the general concentration of a N⁺ layer (Si concentration; $1 \times 10^{18}$–$1 \times 10^{19}$(1/cm³)) as the group III nitride semiconductor device formed on a sapphire substrate.

In general, GaN-based crystal takes three-dimensional growth, because a crystal plane (1-101) and its near high-order planes are dominant in the initial growth stage. When three-dimensionally growing islands start to collide and combine, high-order planes are changing to the plane (1-101) and another stable plane (0001). It is known that the growth rate of the plane (0001) is slow. This probably results from the fact that Ga atoms having reached the plane (0001) migrate over the plane (0001), and are then captured into the plane (1-101). Thus, the plane (1-101) grows more quickly and the plane (0001) remains, so that a film is being slowly flattened.

When a precursor material diffuses quickly, nuclei grow uniformly, and uniform islands are simultaneously generating at a high density during the growth in low pressure, the above mechanism for changing into two-dimensional growth works quickly to flatten the surface of the layer. However, crystal defects such as threading dislocations are generated, when growing planes produced from another initial nuclei collide with each other. Therefore, a dislocation density tends to become higher in a growing mode in which an island density is higher and a combination rate is fast.

When a growth pressure is higher, competition occurs among initial nuclei due to selective growth and large islands are produced at a comparatively low density. Therefore, dislocation density decreases. However, a large and deep pit consisting of the plane (1-101) is easily produced, because islands combine slowly. Therefore, the pit does not disappear, because supply of a precursor material diffusion to the pit is reduced, and tends to become larger as film growth progresses.

However, when the three-dimensional growth is changing to two-dimensional growth, the presence of Mg results in the promotion of migration of Ga atoms on the plane (0001). Therefore, a growth-rate ratio between the plane (1-101) and its near plane further increases, so that the transition from the three-dimensional growth to the two-dimensional growth is promoted.

Thus, Mg is considered as an acceptor-like impurity to be replacable with Ga at a Ga atomic position. It is within the invention to replace Mg with another atomic element as one of the group II elements Be, Ca, and Zn which serve as acceptor-like impurities at the Ga atomic position. Then, it is also within the invention to grow a GaN layer including the replaced element as a dopant.

Moreover, it is found through experiments that it is effective to flatten the surface of the first GaN layer when the pressure of the second GaN layer growth is decreased to a level below that of a first GaN layer growth.

Thus, the second GaN layer can grow while filling voids in the first GaN layer in its growth process, by depositing the non-doped first GaN layer on the low-temperature buffer layer to suppress the generation of threading dislocations, and then depositing a second GaN film with a dopant. Therefore, the number of pits generated in the GaN layer can be reduced. As a result, the surface of the GaN layer can be flattened, while threading dislocations generated inside the GaN layer can be reduced. Thus, the present invention can improve characteristics of the group III nitride semiconductor device comprising the GaN film.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

What is claimed is:

1. A nitride semiconductor device, manufactured by successively forming a group III nitride semiconductor layer $(In_xGa_{(1-x-y)}Al_yN$ ($0 \leq x \leq 1$, $0 \leq y \leq 1$) on a flat surface of a sapphire substrate;
   a low temperature buffer layer formed on said sapphire substrate;
   a first gallium nitride layer having a predetermined thickness and a plurality of voids in a surface thereof, and containing no dopant component, said first gallium nitride layer being formed at a first pressure on said low-temperature buffer layer; and
   a second gallium nitride layer having a second predetermined thickness and containing a dopant component, said second gallium nitride layer being formed at a second pressure on said surface of said first gallium nitride layer and capable of filling in said plurality of voids and flattening said surface of said first gallium nitride layer,
   wherein said first pressure is higher than said second pressure.

2. A nitride semiconductor device manufactured by successively forming a group III nitride semiconductor layer $(In_xGa_{(1-x-y)}Al_yN$ ($0 \leq x \leq 1$, $0 \leq y \leq 1$) on a flat surface of a sapphire substrate, said device comprising:
   a low temperature buffer layer formed on said sapphire substrate;
   a first gallium nitride layer having a predetermined thickness and containing no dopant component, said first gallium nitride layer being formed on said low-temperature buffer layer;
   a second gallium nitride layer having a second predetermined thickness and containing a dopant component, said second gallium nitride layer being formed on said first gallium nitride layer,
   wherein said second gallium nitride layer is formed while flattening said first gallium nitride layer by filling voids in said first gallium nitride layer from the surface thereof; and
   a third gallium nitride layer containing no dopant component, said third gallium nitride layer being formed on said second gallium nitride layer.

3. The nitride semiconductor device according to claim 1, wherein said second gallium nitride film has a thickness sufficient to flatten the surface of the formed second gallium nitride while filling voids in said first gallium nitride layer from the surface thereof.

4. The nitride semiconductor device according to claim 1, wherein said predetermined thickness of said first gallium nitride layer equals a thickness of 0.2–4 µm.

5. A nitride semiconductor device manufactured by successively forming a group III nitride semiconductor layer $(In_xGa_{(1-x-y)}Al_yN$ ($0 \leq x \leq 1$, $0 \leq y \leq 1$) on a flat surface of a sapphire substrate, said device comprising:
   a low temperature buffer layer formed on said sapphire substrate;
   a first gallium nitride layer having a predetermined thickness and containing no dopant component, said first gallium nitride layer being formed on said low-temperature buffer layer; and
   a second gallium nitride layer having a second predetermined thickness and containing a dopant component, said second gallium nitride layer being formed on said first gallium nitride layer,
   wherein said second gallium nitride layer is formed while flattening said first gallium nitride layer by filling voids in said first gallium nitride layer from the surface thereof, and
   wherein said dopant is a group II element.

6. A nitride semiconductor device manufactured by successively forming a group III nitride semiconductor layer $(In_xGa_{(1-x-y)}Al_yN$ ($0 \leq x \leq 1$, $0 \leq y \leq 1$) on a flat surface of a sapphire substrate, said device comprising:
   a low temperature buffer layer formed on said sapphire substrate;
   a first gallium nitride layer having a predetermined thickness and containing no dopant component, said first gallium nitride layer being formed on said low-temperature buffer layer; and
   a second gallium nitride layer having a second predetermined thickness and containing a dopant component, said second gallium nitride layer being formed on said first gallium nitride layer,
   wherein said second gallium nitride layer is formed while flattening said first gallium nitride layer by filling voids in said first gallium nitride layer from the surface thereof, and
   wherein said dopant is magnesium.

7. The nitride semiconductor device according to claim 6, wherein an atomic concentration of said magnesium is $1 \times 10^{18}$ to $5 \times 10^{20}$ (1/cc).

8. The nitride semiconductor device according to claim 1, wherein said dopant comprises one of beryllium, calcium, and zinc.

9. The nitride semiconductor device according to claim 1, further comprising:
   a crystal layer containing a second dopant component, said crystal layer being formed on said second gallium nitride layer.

10. The nitride semiconductor device according to claim 9, wherein said second dopant comprises silicon.

11. The nitride semiconductor device according to claim 10, wherein an atomic concentration of said silicon substantially equals $1 \times 10^{17}$.

12. The nitride semiconductor device according to claim 9, wherein said second dopant comprises nitrogen ions.

13. The nitride semiconductor device according to claim 12, wherein an atomic concentration of said nitrogen ions is $1 \times 10^{18}$ to $1 \times 10^{19}$ (1/cc).

14. The nitride semiconductor device according to claim 2, further comprising:
   a crystal layer containing a second dopant component, said crystal layer being formed on said third gallium nitride layer.

15. The nitride semiconductor device according to claim 14, wherein said second dopant comprises silicon.

16. The nitride semiconductor device according to claim 15, wherein an atomic concentration of said silicon substantially equals $1 \times 10^{17}$.

17. The nitride semiconductor device according to claim 14, wherein said second dopant comprises nitrogen ions.

18. The nitride semiconductor device according to claim 17, wherein an atomic concentration of said nitrogen ions is $1 \times 10^{18}$ to $1 \times 10^{19}$ (1/cc).

* * * * *